United States Patent [19]

Congdon et al.

[11] 4,345,218

[45] Aug. 17, 1982

[54] TWO STAGE THERMAL SHUTDOWN

[75] Inventors: James S. Congdon, Santa Clara; Tim D. Isbell, San Jose, both of Calif.

[73] Assignee: National Semiconductor Corporation, Santa Clara, Calif.

[21] Appl. No.: 185,055

[22] Filed: Sep. 8, 1980

[51] Int. Cl.³ .......................... H03F 3/04; H02H 5/04
[52] U.S. Cl. ...................................... 330/298; 361/103
[58] Field of Search ............................ 330/207 P, 298; 361/103, 106

[56] References Cited

U.S. PATENT DOCUMENTS 4,092,693  5/1978  Ishikawa .............................. 361/103

Primary Examiner—James B. Mullins
Attorney, Agent, or Firm—Gail W. Woodward; James A. Sheridan; Neil B. Schulte

[57] ABSTRACT

In an amplifier circuit the output devices are thermally coupled to a shutdown circuit. A first latch is designed to operate at a first high temperature excursion. The first latch operation acts to shut the output devices off and to invoke a second latch. The second latch operates between a low temperature and a second high temperature that is below the first high temperature. Thus, after the first latch operates, the second latch will operate to cycle between a low temperature whereupon it energizes the output devices and a high temperature at which it deenergizes the output devices. By this action, the circuit will permit only one high temperature peak after which it will cycle between a lower high temperature peak and a low temperature. This avoids repeated cycling to a high temperature that could be deleterious to the circuit devices or the package in which they are housed.

6 Claims, 3 Drawing Figures

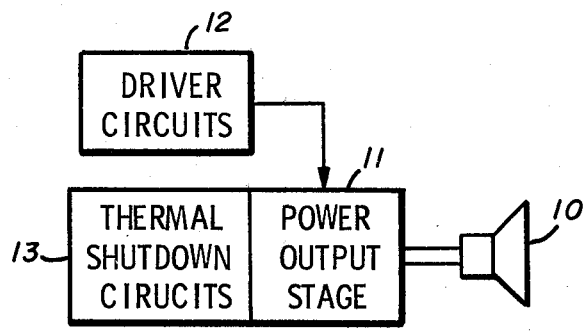
Fig_1 (PRIOR ART)
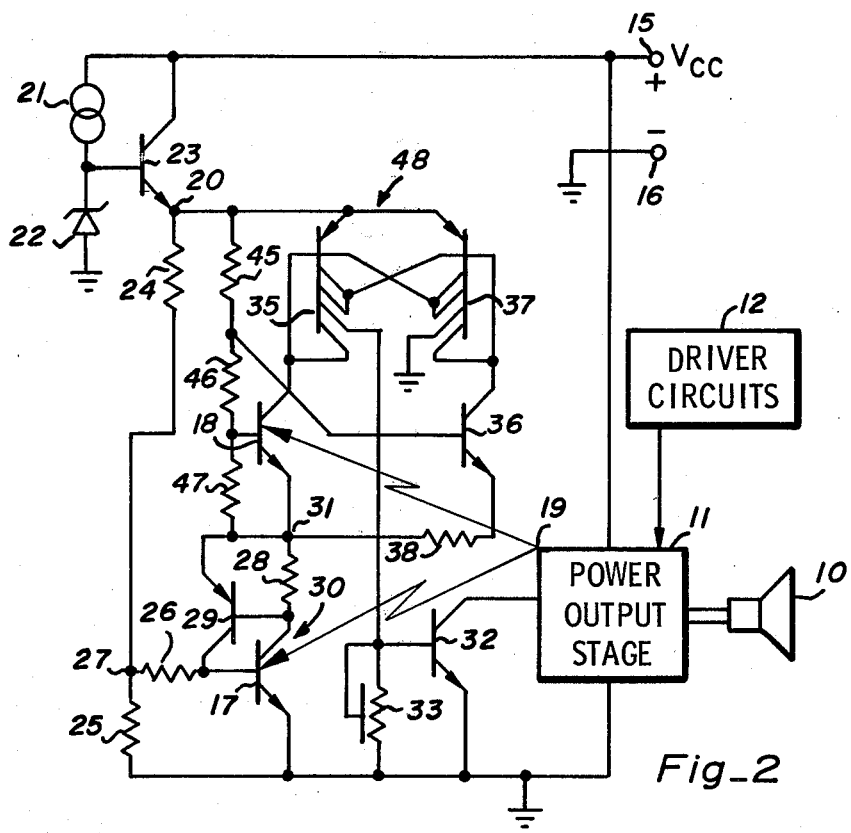
Fig_2
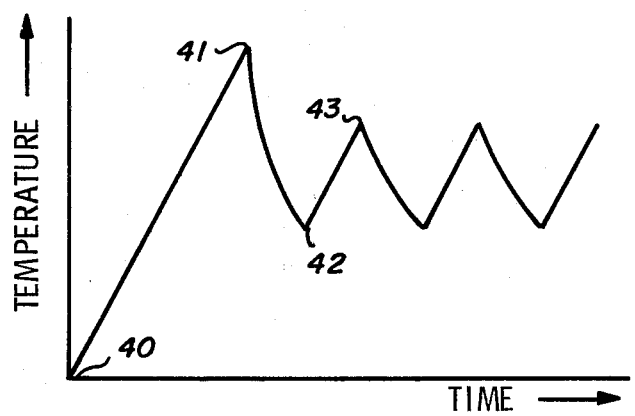
Fig_3

TWO STAGE THERMAL SHUTDOWN

BACKGROUND OF THE INVENTION

A copending patent application by James S. Congdon, Ser. No. 61,158, filed July 26, 1979, U.S. Pat. No. 4,276,516, shows an integrated circuit (IC) power transistor structure designed to improve heat dissipation. The IC layout is disclosed in relation to the overall chip topography. Another copending patent application by James S. Congdon, Ser. No. 56,489, filed July 11, 1979, U.S. Pat. No. 4,263,563, shows a distortion reduction circuit for a power amplifier. This invention relates to such amplifiers and is directed to a circuit for limiting their maximum temperature.

In a typical Class AB or Class B amplifier, the output stage dissipation rises with signal level. In many cases, this can result in excessive temperatures that can damage the output devices. Such excessive dissipation can result from load faults or merely from sustained high signal conditions. In order to avoid damaged output devices, it is common to sense the device temperature and when some maximum is exceeded to either shut the devices off, or to reduce their operating current or voltage.

The invention is directed to a circuit useful in that type of temperature control in which the heat generating devices are shut down, when their temperature rises above some predetermined level.

SUMMARY OF THE INVENTION

It is an object of the invention to employ a plural stage thermal shutdown for a power amplifier.

It is a further object of the invention to employ a circuit to shut a power amplifier off in response to excessive temperature, wherein the circuit responds to a first high temperature and subsequently to a lower high temperature.

It is a still further object of the invention to employ a plurality of successive temperature responsive latches acting to shut down a power output stage in power amplifier, wherein a first latch responds to a high temperature and a subsequent latch responds to a lower high temperature.

These and other objects are achieved in a circuit thermally coupled to an output transistor and configured as follows. A voltage source is created to have a well defined and repeatable temperature coefficient of voltage. A fraction of this voltage is coupled to the input of a first latch with the fraction being selected to keep the latch off until a predetermined first temperature is exceeded. Once the first temperature is exceeded, the latch operates to shut the output transistors off and to activate a second latch. The second latch is current responsive and driven by a transistor, which due to its thermal coupling, changes its current as a function of the output transistor temperature. The second latch operates at a temperature lower than the first latch on temperature and is designed to turn off at a predetermined low temperature. Therefore, once the first temperature is exceeded, the second latch will maintain a lower high temperature limit. If a persistent output transistor overload develops, the second latch will cycle them off at a relatively low temperature that will not harm them. However, a single higher temperature excursion is required to first actuate the circuit.

BRIEF DESCRIPTION OF THE DRAWING

FIG. 1 is a block diagram of a thermal shutdown circuit.

FIG. 2 is a schematic diagram of the two-stage thermal shutdown circuit of the invention.

FIG. 3 is a graph, showing the thermal performance of the circuit of FIG. 2.

DESCRIPTION OF THE INVENTION

FIG. 1 is a block diagram of the conventional thermal shutdown arrangement, which is also employed in the invention. A loudspeaker 10 is driven by a power output stage 11. Driver circuits 12 operate output stage 11 in the desired manner. Thermal shutdown circuits 13 are shown adjacent to output stage 11 to denote thermal coupling. Shutdown circuits 13 sense the temperature of output stage 11 and when a particular temperature is exceeded, deenergize the output stage to relieve the overload.

There have been numerous thermal shutdown circuits disclosed in the past. Some operate linearly to control circuit current or voltage, while others operate cyclically to shut down the output stage when it exceeds a critical temperature and then restore operation after the output stage has cooled down. The cyclic control is preferred ordinarily, for audio amplifiers because linear control will often act to produce severe distortion. With cyclic operation, the audio amplifier will go off and on, thereby indicating overload conditions to the user. But when on, the amplifier operates normally and the shutdown circuitry will not create distortion.

Using cyclic shutdown has advantages, but can create a problem when a continuous overload is present. With this condition, the output stage will continue to cycle on and off and a series of temperature extremes will be imposed on the output stage devices. This can seriously impair their reliability and shorten their lives. For example, if the output stage devices are housed in plastic packages, the maximum temperature at which the shutdown circuits work may be above the glass transition temperature of the encapsulant. This can lead to housing failure after a number of cycles. In any event, such shutoff cycling can produce solder joint failures and/or lead wire failures.

According to the invention, the deleterious effects of cycling can be greatly reduced by allowing only one or a few high temperature excursion. Thereafter, the cycling is limited to a substantially lower temperature maximum. Thus, even though a condition may exist that results in cycling, the reduced maximum temperature produces much less serious failure-causing cycles. The single or a few high temperature excursions will be very unlikely to result in serious damage.

FIG. 2 is a schematic diagram of a circuit suitable for practicing the invention. While the entire circuit can be in thermal contact with output stage 11, it is essential that at least transistors 17 and 18 be thermally associated with output stage 11 as shown by coupling line 19.

The circuit operates from a power supply connected between $+V_{CC}$ terminal 15 and ground terminal 16.

A voltage is developed at node 20 as follows. Current source 21 reverse biases Zener diode 22 into its breakdown region and sets the bias voltage at the base of transistor 23. Since transistor 23 is an emitter follower, the voltage at node 20 will be one $V_{BE}$ below the Zener voltage. Typically, this voltage will be about 4.8 volts at 25° C. The Zener diode has a typical temperature coefficient of about 1.5 mv/°C. Since the temperature coefficient of an on transistor is about 2 mv/°C. the temperature coefficient of voltage at node 20 is about 3.5 mv/°C. (because the $V_{BE}$ opposes the Zener voltage). Thus, node 20 will be at about 4.8 volts at 25° C., and about 5.3 volts at 170° C. Such a voltage source has a low internal impedance and the voltage rises with temperature in a well controlled and predictable manner. Thus, if the circuit of FIG. 2 is coupled thermally to output stage 11, the voltage at node 20 would be a measure of output stage temperature. It is to be understood that while a positive temperature coefficient is employed, it would be zero or even slightly negative if desired. The main requirement is repeatability.

The voltage at node 20 is divided by resistors 24 and 25 and a fraction of the node 20 voltage is coupled by resistor 26 to the base of transistor 17. For example, the voltage at node 27 can be adjusted to 0.3 volt (at 25° C.) which will be insufficient to turn transistor 17 on. With transistor 17 off, there is no current through resistor 28, which is connected between the emitter and base of transistor 29 and transistor 29 will be turned off. It can be seen that transistors 17 and 29 form a first latch 30 that will normally be off. Node 31 will be at the potential of node 20 and the entire circuit will be off.

Transistor 32 will be off because resistor 33 will pull its base low. Transistor 32 is intended to operate as a switch that is coupled to output stage 11 so as to disable it when on. Typically the collector of transistor 32 will shunt the current sources in output stage 11. Therefore, as long as transistor 32 is off, the amplifier will function normally.

If by some chance output stage 11 becomes overloaded, it will proceed to heat and the node 20 voltage will rise. At the same time, since transistor 17 is thermally coupled to output stage 11 (by line 19), its base to emitter turn on voltage will drop at a rate of about 2 mv/°C. Whereas at 25° C., transistor 17 will turn on at about 0.6 volt, at 175° C. it will turn on at only 0.3 volt. Thus, the voltage at node 27, which has risen only sightly, will turn transistor 17 on. This pulls the base of transistor 29 down and turns it on. This in turn pulls the base of transistor 17 up still more and the circuit latches on. This latch 30 action pulls node 31 down and current will flow from node 20 through the resistor divider 45–47.

The voltage drop across resistor 47 is large enough to turn transistor 18 on, because it too is thermally coupled to output stage 11. Conduction in transistor 18 also turns plural collector transistor 35 on because it acts as the load for transistor 18. One of the collectors of transistor 35 is coupled to transistor 32, which turns on and disables output stage 11. The output stage will then proceed to cool. It is to be noted that once latch 30 turns on, it will stay on until the power supply at terminals 15 and 16 is removed. Thus, latch 30 will function once after the circuit is first energized and the output stage 11 temperature has risen to turn transistor 17 on. This first temperature threshold will be set by the relative values of resistors 24 and 25.

Once the circuit acts, to turn transistor 32 on, output stage 11 will cool. At this point, a second latching circuit 48 comes into operation. It will be noted that PNP load transistors 35 and 37, which operate with transistors 18 and 36 respectively, are plural collector devices each with one collector coupled back to its base and a pair of collectors cross coupled to create a current latch. Each of transistors 35 and 37 is shown having four collectors. These devices are fabricated with a circular emitter surrounded closely by a four equal-arc collector ring. Two collectors of each are tied together and one of each connected back to its base. The fourth collector of transistor 35 is the latch 48 output, which is connected to the base of transistor 32. The fourth collector of transistor 37 is grounded.

As long as transistor 17 is latched on, current will flow in the voltage divider composed of resistors 45–47. The base of transistor 36 is returned to a point that will keep it on and emitter resistor 38 degenerates transistor 36, so that its current is substantially constant. By way of explanation, it will be assumed that 100 microamperes will flow in transistor 36. This current pulls the base of transistor 37 down and turns it on. Thus, each of the four collectors will draw 100 microamperes. Since the pair of collectors in transistor 37 need 200 microamperes, they will hold the base of transistor 35 high, until transistor 18 supplies more than 200 microamperes. Thus, a threshold current is established for turning transistor 35 on (and in turn to turn transistor 32 on). Once transistor 35 is turned on, its pair of collectors will pull the base of transistor 37 up and turn it off.

As the current in transistor 18 is decreased, transistor 35 will remain on until it can no longer supply the 100 microamperes for transistor 36. It is clear that transistor 36 will remain on until the current in transistor 18 drops to 50 microamperes, at which time the collector pair current drops below 100 microamperes. When this occurs, transistor 35 will turn off and transistor 37 will turn on. Thus, a latch 48 is present that responds to the current in transistor 18. The 4 to 1 hysteresis is determined solely by the lateral transistor geometry. The paired collectors produce the desired current responsive hysteresis.

Now as output stage 11 heats, the current in transistor 18 will rise due to its thermal coupling. At about 200 microamperes transistor 35 will turn on and by way of transistor 32, turn output stage off. When the cooling has dropped the current in transistor 18 to 50 microamperes, latch 48 switches and output stage 11 is again energized. Thus, if the output overload persists, the cycling will be determined by the bias on transistor 18 and the above described hysteresis. The continuous cycling can be adjusted so the maximum temperature is low enough to protect the critical output stage 11 elements.

FIG. 3 is a graph that illustrates the circuit operation. The origin 40 is at room temperature. If an overload is present, the temperature will climb until a first trip point is reached at 41. At 41, the first latch 30 operates and turns output stage 11 off. The temperature will then decline to point 42, whereupon the second latch 48 operates to turn transistor 35 off. If the overload is still present, heating will again occur to point 43 at which second latch 48 will again operate. This cycling will continue as long as the overload exists and the circuits remain energized.

If no overload exists and point 41 is never reached, the first latch 30 will never come on and the amplifier will remain fully functional. The circuit is calibrated so that the temperature of point 41 is high enough to keep the system operative even with slight overloading that is not bad enough to be harmful. Once an overload is present, the circuit will operate to relieve it. If the overload vanishes so that the temperature of point 43 is never reached, the system will function normally. Thus, a single high temperature, above point 43, will not invoke shutdown. However, a subsequent high temperature will be relieved at a lower value and any continuous cycling will be below the original high temperature value.

Clearly, the circuit could be modified so that two or more high temperature peaks could be permitted before switching to the lower temperature peak. This could be done by employing a series of latches coupled as a shift register. The number of high temperature peaks permitted would be determined in accordance with the reliability of the output stage 11 devices.

EXAMPLE

The circuit of FIG. 2 was constructed using conventional monolithic PN junction isolated IC devices. NPN transistors 17, 18, 32 and 36 were all conventional PN junction isolated devices. PNP lateral transistor 29 was located within the collector region of transistor 17. Plural collector PNP lateral transistors 35 and 37 were located within the collector regions of transistors 18 and 36, respectively. The circuit was constructed in an IC chip that also contained the power output transistors of a 20 watt audio amplifier. By constructing the circuit near to the output transistors close thermal coupling was achieved where desired. The resistor values were as follows:

| Resistor | Value (Ohms) |
|---|---|
| 24 | 4.7K |
| 25 | 315 |
| 26 | 1K |
| 28 | 3.3K |
| 38 | 6.2K |
| 45 | 3.6K |
| 46 | 620 |
| 47 | 400 |

The circuit operated on a first peak (point 41 of FIG. 3) of about 170° C. The lower point 42 was about 120° C. and the subsequent high temperature point 43 was about 140° C. Since the glass transition temperature of the plastic housing was about 150° to 160° C., a continuous cycling under overload conditions had no significant effect. Yet the device temperature had to exceed 170° C. for the circuit to first operate.

The circuit has been described and an operating example given. Clearly upon reading the foregoing alternatives and equivalents, within the spirit and intent of the invention, will occur to a person skilled in the art. For example, while the preferred embodiment relates to a class B or AB audio amplifier, the invention could apply to any heat generating semiconductor device. Accordingly, it is intended that the scope of the invention be limited only by the following claims.

We claim:

1. A circuit for protecting a semiconductor device from temperature increasing overloads, said circuit acting to shut said device off when its temperature exceeds a maximum value and then acting to turn said device on when the temperature has declined to a lower value, said circuit comprising:
   means for thermally coupling at least portions of said circuit to said device;
   voltage source means having a controlled and repeatable temperature coefficient of voltage;
   disabling means coupled to said device and responsive to a control signal;
   first latch means responsive to said voltage source means, coupled to said disabling means to supply said control signal, and operative to turn said device off when said device temperature exceeds a predetermined first maximum value; and
   second latch means responsive to said first latch means and to said voltage source, said second latch means being coupled to said disabling means to turn said device off when said device temperature exceeds a predetermined second maximum temperature that is substantially lower than said first maximum temperature, whereby said circuit will permit an excursion to said first maximum temperature and will thereafter limit excursions to said second maximum temperature.

2. The circuit of claim 1, wherein said second latch means includes means for turning said device on when its temperature reaches a predetermined low temperature value.

3. The circuit of claim 2, wherein said second latch is current responsive with said second maximum and said low temperatures are ratioed by geometrical means in said second latch.

4. The circuit of claim 3, wherein the current applied to said second latch is obtained from a first transistor that is thermally coupled to said device.

5. The circuit of claim 1 in which said first latch includes a second transistor that is thermally coupled to said device and is biased at a fraction of said voltage source means output, said fraction being set so that said first latch means is biased off at temperatures below said first maximum value.

6. The circuit of claim 5, wherein said first latch comprises said second transistor coupled to a third transistor, complementary to said second transistor and connected thereto in a latching configuration.

* * * * *